United States Patent [19]

Simpson et al.

[11] Patent Number: 5,347,520
[45] Date of Patent: Sep. 13, 1994

[54] BOUNDARY-SCAN ENABLE CELL WITH NON-CRITICAL ENABLE PATH

[75] Inventors: David L. Simpson; Wilson E. Smoak, III, both of West Columbia, S.C.

[73] Assignee: NCR Corporation, Dayton, Ohio

[21] Appl. No.: 761,607

[22] Filed: Sep. 18, 1991

[51] Int. Cl.5 .......................................... H04B 17/00
[52] U.S. Cl. ................................ 371/22.3; 371/22.1; 371/22.5
[58] Field of Search .................. 371/22.1, 22.2, 22.3, 371/22.4, 22.5, 22.6

[56] References Cited

U.S. PATENT DOCUMENTS

| | | | |
|---|---|---|---|
| 4,912,709 | 3/1990 | Teske et al. | 371/22.1 |
| 4,961,013 | 10/1990 | Obermeyer, Jr. et al. | 307/480 |
| 5,084,874 | 1/1992 | Whetsel, Jr. | 371/22.3 |
| 5,103,450 | 4/1992 | Whetsel | 371/22.3 X |

OTHER PUBLICATIONS

IEEE Std. 1149.1-1990, "IEEE Standard Test Access Port and Boundary-Scan Architecture", May 21, 1990.
"A Standard Test Bus & Boundary Scan Architecture" by Lee Whetsel, TI Technical Journal, Jul.-Aug. 1988, pp. 48-59.

Primary Examiner—Jack B. Harvey
Assistant Examiner—Eric W. Stamber
Attorney, Agent, or Firm—Paul W. Martin

[57] ABSTRACT

A boundary-scan enable cell which includes critical and non-critical enable paths without adding an extra layer of logic. The boundary-scan cell includes a multiplexer, a critical enable path which transmits critical enable terms coupled to a first multiplexer input, a sampling circuit which transmits non-critical terms coupled to a second multiplexer input, and a non-critical term path which transmits non-critical masking terms, coupled to the shift input of the multiplexer. Non-critical terms at the shift input are mimicked at the second input. Provision is also made for a test control circuit and a circuit for monitoring critical and non-critical terms.

3 Claims, 1 Drawing Sheet

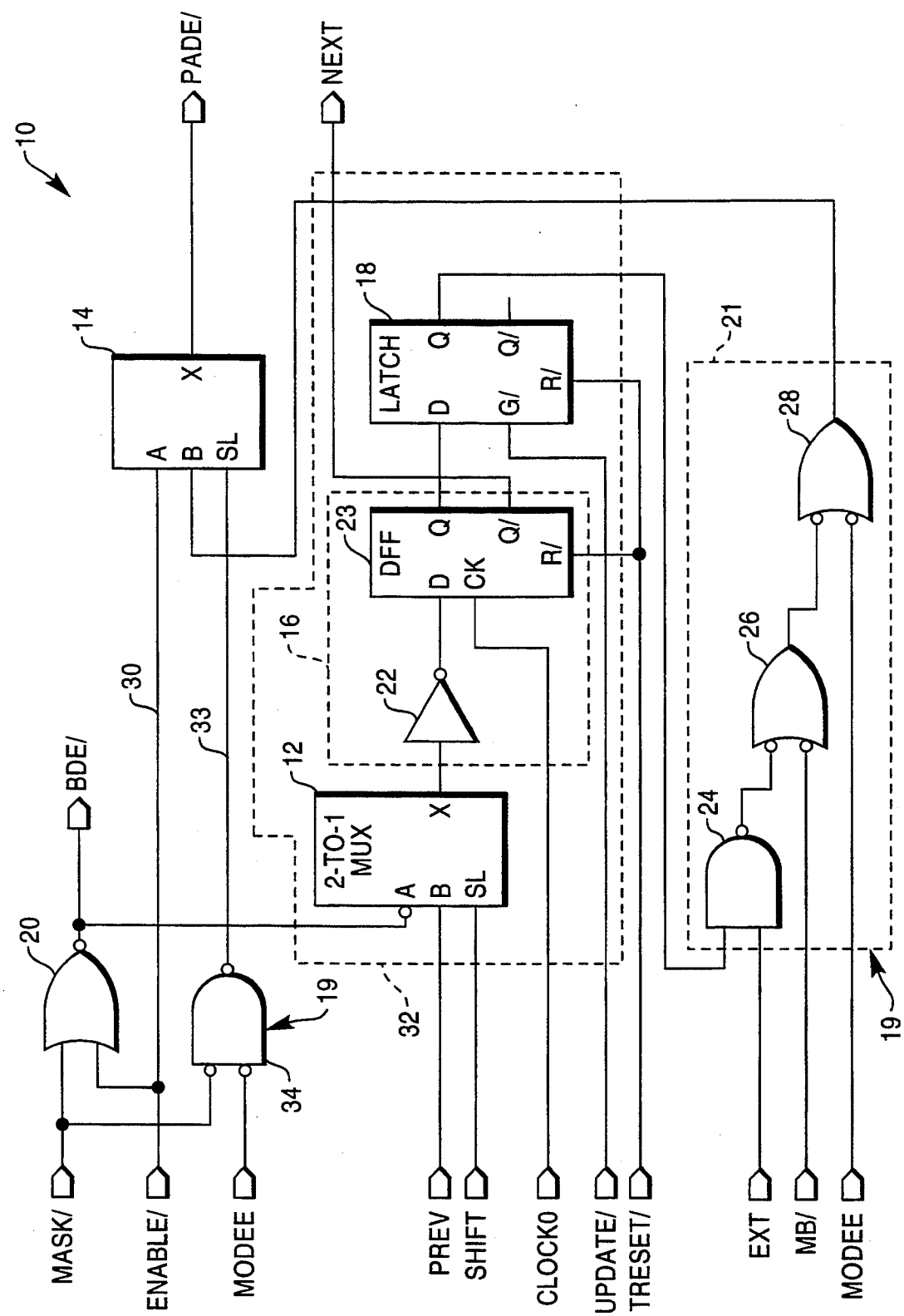

BOUNDARY-SCAN ENABLE CELL WITH NON-CRITICAL ENABLE PATH

CROSS REFERENCE TO RELATED APPLICATIONS

The present invention is related to the following commonly assigned and co-pending U.S. applications:

Ser. No. 07/761,126, entitled, "Boundary-scan Input Cell for a Clock Pin", and invented by Simpson;

Ser. No. 07/761,141, now U.S. Pat. No. 5,260,950, entitled, "Boundary-scan Input Circuit for a Reset Pin", and invented by Simpson and Langford;

Ser. No. 07/762,098, allowed, entitled, "Boundary-scan Output Cell with a Non-critical Enable Path", and invented by Simpson and Smoak; and Ser. No. 07/668,531, abandoned, entitled, "Bi-directional Boundary-scan Circuit", and invented by Simpson and Hutton.

BACKGROUND OF THE INVENTION

The present invention relates to boundary scan logic and more specifically to a boundary-scan enable cell with a non-critical enable path.

Boundary-scan logic circuitry is commonly added to integrated circuits for testing and monitoring the integrated circuits. A discussion of boundary-scan logic can be found in the following publications: (1) IEEE standard 1149.1, entitled, "IEEE Standard Test Access port and Boundary-Scan Architecture", dated May 21, 1990; and (2) "A Standard Test Bus and Boundary Scan Architecture", by Lee Whetsel, TI Technical Journal, July–August 1988. These publications are hereby incorporated by reference.

Boundary-scan logic normally includes boundary-scan cells coupled between the pins and the system logic of an integrated circuit for external testing of pin connections and internal testing of system logic. Boundary-scan cells include test signal inputs and outputs through which the cells may be connected and scanned in serial fashion. One type of boundary-scan cell is an enable cell for providing a tristate enable signal for controlling the drive strength of an output driver.

Logic terms making up the core logic output include critical and non-critical terms. Critical terms are those which are active during normal operation and which must propagate to predetermined device pins in a minimal amount of time. Non-critical terms are those which may change only during diagnostics, error conditions, or other infrequent events. Such terms are generally asynchronous to the system clock or do not have strict timing requirements. Finally, non-critical enable terms can be used as masking terms to force an enable signal to be asserted or negated.

Boundary-scan cells normally include a shift register element, a shadow latch, and two multiplexers. One multiplexer selects between a core logic output defining a system path for carrying system tristate enable terms and a shadow latch output defining a test path for carrying test data. An inherent problem with these cells is that the one multiplexer causes delay in the transmission of system enable terms.

Therefore, it would be desirable to provide a boundary scan enable cell which separates critical enable terms from non-critical masking terms while minimizing the delay added to the system path.

SUMMARY OF THE INVENTION

In accordance with the teachings of the present invention, a boundary-scan enable cell with a non-critical path is provided. The boundary-scan enable cell includes a selector element having first, second, and shift inputs. A critical enable path couples system logic and the first input of the selector element. A non-critical term path couples system logic to the shift input. A sampling circuit couples between the system logic and the second input of the selector element.

The sampling circuit employs a multiplexer having a term input and a previous cell contents input. A shift register is coupled to the output of the multiplexer. A latch is coupled between the output of the shift register and the second input of the selector element.

Provision is also made for a test control circuit as part of the sampling circuit, including a first subcircuit coupled between the latch output and the second input of the selector element, and a second subcircuit coupled between the system logic and the shift input of the selector element.

A monitoring circuit, coupled between the system logic and the term input of the multiplexer, also has a test output for comparison with a twin cell.

The boundary-scan enable cell of the present invention is operative to transmit non-critical masking terms from system logic through the selector element without adding an extra layer of logic.

It is accordingly an object of the present invention to provide a boundary-scan enable cell.

It is another object of the present invention to provide a boundary scan enable cell which includes separate circuit paths for critical and non-critical terms without adding an extra layer of logic.

BRIEF DESCRIPTION OF THE DRAWING

Additional benefits and advantages of the present invention will become apparent to those skilled in the art to which this invention relates from the subsequent description of the preferred embodiments and the appended claims, taken in conjunction with the accompanying drawing, in which:

FIG. 1 is a schematic diagram of the boundary-scan enable cell of the present invention.

DETAILED DESCRIPTION OF THE PREFERRED EMBODIMENT

Referring now to FIG. 1, boundary-scan enable cell 10 primarily includes multiplexer 12, selector element 14, shift register 16, and latch 18. Multiplexer 12 samples critical enable terms from system logic through monitoring circuit 20 and test data from a previous boundary-scan cell. Input ENABLE/ receives critical enable terms and input MASK/ receives non-critical masking terms. Monitoring circuit 20 is preferably a NOR gate, which produces a test output BDE/ and a term output for sampling. The previous cell input originates from input PREV. A shift input SHIFT is also provided.

Output X of multiplexer 12 couples to shift register 16, which includes inverter 22. Preferably, register 16 employs D-type flip-flop 23. Register 16 additionally receives system clock signal CLOCK0 and test reset input TRESET/. Output Q/ couples to another boundary-scan cell and is labeled NEXT.

Output Q of shift register 16 couples to latch 18. Latch 18 additionally receives test reset input TRE- SET/and update input UPDATE/for updating the contents of latch 18 with the contents of register 16.

Output Q of latch 18 couples to selector element 14 through first subcircuit 21 of test control circuit 19. Preferably, selector element 14 is a second multiplexer. First subcircuit 21 includes logic elements 24–28, which preferably are NAND gates. Logic element 24 receives an external test input EXT. Logic element 26 receives a built-in-self-test (BIST) input MB/. Finally, logic element 28 receives a mode input MODEE.

Selector element 14 receives critical enable terms from input ENABLE/along critical enable path 30 and provides enable output PADE/. Non-critical masking terms from input MASK/travel to shift input SL along non-critical term path 33. Non-critical masking terms are also transmitted through sampling circuit 32, which includes logic elements 12, 16, 18, and 21. Advantageously, non-critical masking terms at shift input SL of selector element 14 are mimicked at input B.

Non-critical term path 33 passes through test control subcircuit 34, which is preferably an OR gate. Subcircuit 34 receives inputs MASK/and MODEE.

During normal operation, critical enable terms from system logic pass through input ENABLE/and travel via critical enable path 30 through input A of selector element 14. The non-critical masking terms are asserted and therefore have no effect upon the state of tristate pad enable output PADE/.

During default operation, non-critical masking terms from system logic are negated and pass through input MASK/and travel through subcircuit 34 and along non-critical term path 33 to shift input SL of selector element 14. Non-critical masking terms also travel through sampling circuit 32 and cause input B of selector element 14 to go high. Thus, when negated, the non-critical masking terms negate output PADE/. Input B equals the state of non-critical masking terms at input SL; non-critical masking terms at input SL of selector element 14 output their equivalent at input B to tristate pad enable output PADE/.

Advantageously, sampling circuit 32 and non-critical term path 33 provide paths for non-critical masking terms without adding delay to critical path 30 and without adding additional levels of logic.

During boundary-scan testing, input B of selector element 14 is selected. Boundary-scan testing is described in the incorporated references. Test reset input TRESET/is strobed such that output Q of latch 18 is low. Input MODEE is high. Selector element 14 selects to output test data from latch 18 through logic elements 24–28. Enable terms from monitoring circuit 20 are captured by shift register 16. Multiplexer 12 is shifted to allow shift register 16 to capture previous cell input PREV and output the current contents of shift register 16 to the next cell through output NEXT. Output PADE/is negated for all tests except for an IEEE standard "external" test which is applied at input EXT and a built-in-self-test (BIST) which is applied at input MB/.

Logic elements 24–28 of test control subcircuit 21 serve to enable external or built-in test instructions. Thus, during a BIST, input MODEE is asserted (high), input MB/ is asserted (low), input EXT is not asserted (low). Preferably, the BIST is defined to drive all chip outputs.

During a standard external test, input EXT is asserted (high), input MB/ is not asserted (high). Output PADE-/is determined by test instructions.

Although the invention has been described with particular reference to certain preferred embodiments thereof, variations and modifications of the present invention can be effected within the spirit and scope of the following claims.

What is claimed is:

1. A boundary-scan cell for testing a system logic and its pin connections comprising:

a monitoring circuit including a NOR gate having critical enable term and non-critical term inputs and having a term output and a test output for comparison with a twin cell;

a first multiplexer having critical enable term, non-critical term, and shift inputs;

a sampling circuit coupled between the term output of the monitoring circuit and the non-critical term input of the first multiplexer including a second multiplexer having a term input and a previous cell contents input, a shift register coupled to the output of the second multiplexer including an inverter coupled to the output of the second multiplexer and a D-type flip-flop coupled to the output of the inverter, and a latch coupled between the output of the shift register and the non-critical term input of the first multiplexer; and a test control circuit including a first subcircuit coupled between the latch output and the non-critical term input of the first multiplexer including a first NAND gate having latch and first test inputs, a second NAND gate having first NAND gate and second test inputs, and a third NAND gate having second NAND gate and third test input and a non-critical term output, and a second subcircuit coupled between the system logic and the shift input of the first multiplexer including an OR gate having non-critical term and third test inputs.

2. A device for isolating an input/output pad from an integrated circuit comprising:

a monitoring circuit including a NOR gate having critical enable term and non-critical term inputs and having a term output and a test output for comparison with a twin cell;

a first multiplexer having critical term, non-critical term, and shift inputs, the device selecting the critical term input during normal operation of the integrated circuit and the non-critical term input during both test and default operation of the integrated circuit;

a sampling circuit coupled between the term output of the monitoring circuit and the non-critical term input of the first multiplexer including a second multiplexer having a term input and a previous device contents input, a shift register coupled to the output of the second multiplexer, and a latch coupled between the output of the shift register and the non-critical term input of the first multiplexer; and a test control circuit coupled between the integrated circuit and the shift inputs of the first multiplexer including an OR gate having non-critical term and third test inputs.

3. The device as recited in claim 2, wherein the test control circuit further comprises:

a first subcircuit coupled between the latch output and the non-critical term input of the first multiplexer including a first NAND gate having latch and first test inputs, a second NAND gate having first NAND gate and second test inputs, and a third NAND gate having second NAND gate and third test input and a non-critical term output.

* * * * *